(12) United States Patent
Peng

(10) Patent No.: US 7,539,021 B2
(45) Date of Patent: May 26, 2009

(54) RETENTION DEVICE

(75) Inventor: Ying-Chao Peng, Taipei (TW)

(73) Assignee: Inventec Corporation, Taipei (TW)

( * ) Notice: Subject to any disclaimer, the term of this patent is extended or adjusted under 35 U.S.C. 154(b) by 97 days.

(21) Appl. No.: 11/872,780

(22) Filed: Oct. 16, 2007

(65) Prior Publication Data

US 2009/0097216 A1 Apr. 16, 2009

(51) Int. Cl.
*H05K 5/00* (2006.01)

(52) U.S. Cl. .................. 361/759; 361/752; 361/790; 361/800

(58) Field of Classification Search .......... 361/759, 361/600, 688, 704, 717–719, 752, 790, 797, 361/800, 742, 748, 715; 312/223; 174/138 R, 174/138 E, 138 G, 137 R
See application file for complete search history.

(56) References Cited

U.S. PATENT DOCUMENTS

| | | | | |
|---|---|---|---|---|
| 6,113,402 A | * | 9/2000 | Joo | 439/157 |
| 6,669,313 B2 | * | 12/2003 | Liao | 312/7.2 |
| 7,298,609 B2 | * | 11/2007 | Jeong | 361/679.55 |
| 7,342,808 B2 | * | 3/2008 | Chen et al. | 361/801 |
| 7,426,116 B1 | * | 9/2008 | Peng | 361/756 |
| 7,430,129 B1 | * | 9/2008 | Peng | 361/807 |

* cited by examiner

*Primary Examiner*—Hung S Bui
(74) *Attorney, Agent, or Firm*—Workman Nydegger

(57) ABSTRACT

A retention device is applied in an electronic device that has a case and a circuit board. The circuit board may shifts along a integrate direction or a release direction. The retention device includes a fastener, a latching member, and a releasing member. The fastener is movably disposed on the case and has a stopping portion. The latching member is disposed on one side of the circuit board. The releasing member is movably disposed on the case and is located on one side of the fastener, and pushes the fastener to shift. The latching member shifts along the integrate direction with the circuit board, pushes the fastener to shift, and is blocked by the stopped portion. When the fastener is pushed by the releasing member to shift, the latching member is separated along the release direction, such that the circuit board is fixed on or detached from the case.

9 Claims, 9 Drawing Sheets

RETENTION DEVICE

BACKGROUND OF THE INVENTION

1. Field of Invention

The present invention relates to a retention device, and more particularly to a retention device for locking and fixing a circuit board without bolts.

2. Related Art

Currently, with the rapid development of science, technology and information, a computer device has become a quite popular electronic device. In the current market, computer devices, such as desktop computers, notebook computers, or servers, are all provided with a mainboard therein as a kernel member of a compute system, so that computer peripheral hardware, such as a central processing unit (CPU), a memory module, and a PCI card, electrically connected to the mainboard may perform default functions successfully.

The mainboard is usually fixed as follows. A plurality of conductive bosses is formed on a case of a computer device as fixing means, and a plurality of through holes corresponding to the conductive bosses is formed in the mainboard. The mainboard is laid on the conductive bosses to keep a suitable distance from the case, and then, a plurality of bolts penetrates the through holes of the mainboard, and are locked on the conductive bosses, with a result that the mainboard is suspended by the aid of the conductive bosses, and leg contacts on the back side of the mainboard are prevented from directly contacting the case to cause a short circuit.

With regard to the conventional method of locking and fixing the mainboard by the conductive bosses, when the mainboard is being mounted and dismounted, a user has to lock and release the bolts one by one with the same actions, which is quite complicated and time-consuming and also inconvenient in practical use. Furthermore, the present electronic device is required to be light, thin, short, and small, but too many conductive bosses will occupy more area of the mainboard. The circuit layout on the mainboard cannot be achieved easily, and the volume of the whole electronic device cannot be microminiaturized, either.

In recent years, a thumb screw emerges is developed, which may be screwed directly by hand, so as to serve as a positioning means for fixing the mainboard. As shown in FIG. 1, it is a schematic view of fixing a circuit board 20 on a case 10 using a thumb screw 60 under a normal circumstance. The case 10 has a plurality of positioning posts 11 with a screw hole 61, in which a neck 12 is formed around the middle portion of each positioning post 11. The circuit board 20 has a plurality of positioning holes 21 corresponding to the positioning posts 11. Each of the positioning holes 21 shapes like a calabash and has a wide section 22 and a narrow section 23, and the front end of each positioning post 11 penetrates the wide section 22 of the positioning hole 21. In this manner, the circuit board 20 may slide on the case 10 by the positioning posts 11, so that the narrow section 23 of each of the positioning hole 21 is engaged into each of the neck 12 of the positioning posts 11. Subsequently, the circuit board 20 may be fixed on the case 10 merely by making the thumb screw 60 penetrate the circuit board 20 and screw it into the screw hole 61.

The method of locking the circuit board on the mainboard by using the thumb screw may significantly reduce the quantity of the conductive bosses and solve the problems caused by the method of locking the mainboard by the conductive bosses. However, the method of locking the mainboard by the thumb screw is still a locking method by screwing, and through this method, the process of mounting and dismounting the mainboard is too complicated and time consuming. Furthermore, the cost of the thumb screw is also higher than that of the conventional bolt, thereby causing a high manufacturing cost.

For person skilled in the art, it is an urgently problem that how to truly fix the mounting position of the mainboard in a screwless manner, and enable users to mount and dismount the mainboard rapidly and conveniently.

SUMMARY OF THE INVENTION

In view of the aforementioned problems, the present invention provides a retention device, so as to solve the problems existing in the conventional mainboard is mounted and dismounted by a screwing manner, the volume of an electronic device cannot be microminiaturized, and the mounting and dismounting period is too complicated and time-consuming and achieves the locking purpose by using a tool, thereby causing a high manufacturing cost and inconvenience in operation.

The retention device of the present invention is applied in an electronic device. The electronic device has a case and a circuit board. The circuit board may shift relative to the case along a integrate direction or a release direction, so as to get caught by the case or detached from the case, and the circuit board is fixed on the case by the retention device.

The retention device includes a fastener, at least one first elastic member, a latching member, and a releasing member. The fastener is movably disposed on the case and has a stopping portion and a pushing portion. A moving direction of the fastener forms an angle with the integrate direction or the release direction. One end of the first elastic member is disposed on the case, and normally pushes the fastener, such that the fastener maintains at the fixing position. The latching member is mounted on one side of the circuit board facing to the fastener. When the latching member shifts along the integrate direction with the circuit board to push the fastener to shift, and the fastener returns to the fixing position through the first elastic member, such that the stopping portion blocks the latching member, and the circuit board is fixed on the case.

The releasing member is movably disposed on the case and is located on one side of the fastener facing to the case. The releasing member has a first guide chamfer leaning against the pushing portion of the fastener. A moving direction of the releasing member and a moving direction of the fastener are offset, so when the releasing member is moved, the first guide chamfer may push the fastener to move to separate from the fixing position, such that the latching member is released from the stopping portion, and the circuit board is detached from the case.

The function of the present invention lie in that, the circuit board of the electronic device can be stably mounted on the case by the blocking of the retention device according to the present invention. Users may mount or dismount the circuit board more easily and rapidly without screwing or unscrewing a plurality of screws, and may fix the position of the circuit board in a screwless manner.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The retention device disclosed in the present invention is applied in an electronic device which likes a computer device provided with a circuit board to execute actions, such as a desktop computer, a notebook computer, or a sever, but not limit to the above-mentioned electronic devices. In the following detailed description of the present invention, a notebook is used as a preferred embodiment of the present invention. The accompanied drawings are merely provided for reference and illustration and are not intended to limit the present invention.

Figure 1:
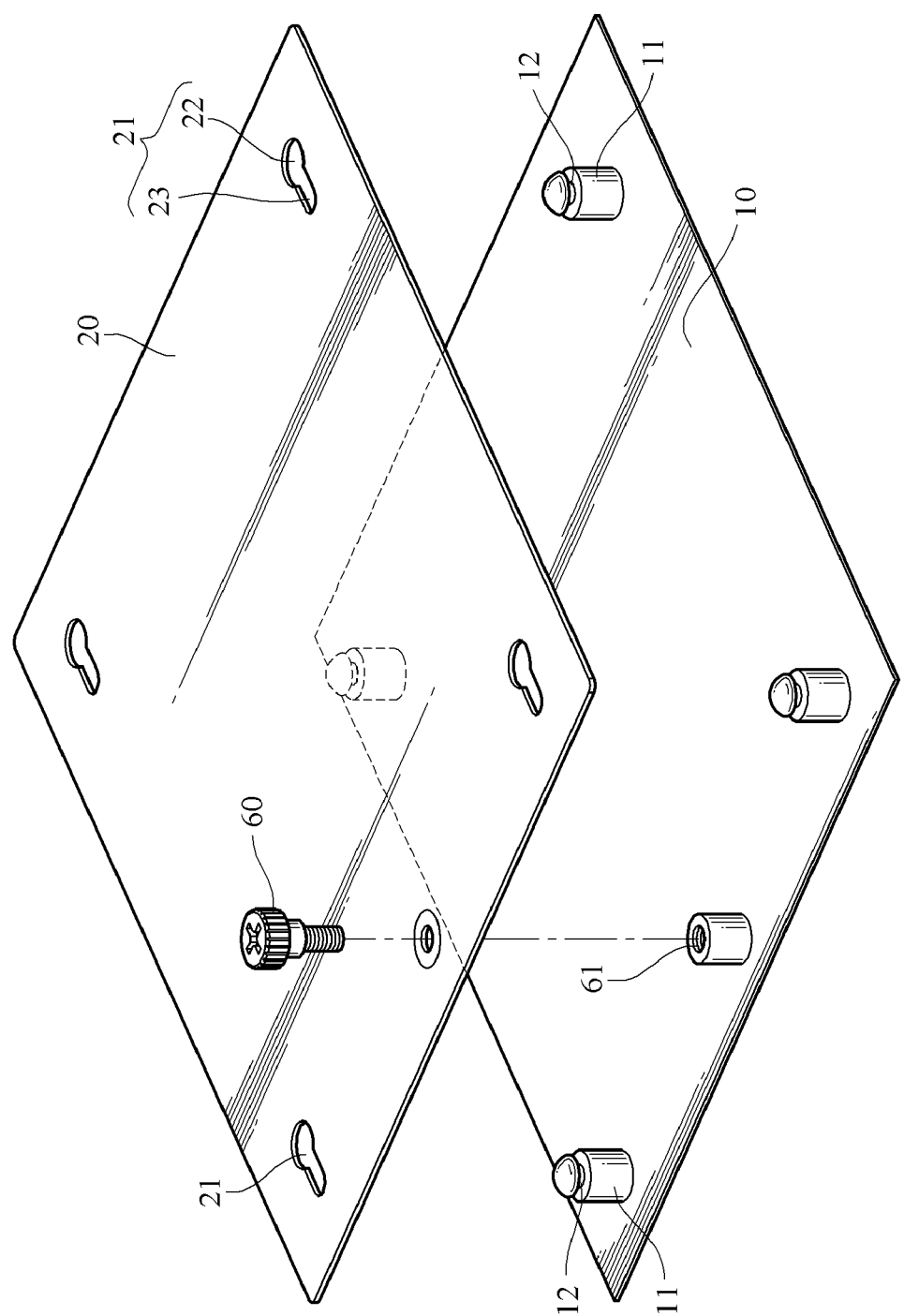
FIG. 1 is an exploded view of the conventional art.
Figure 2:
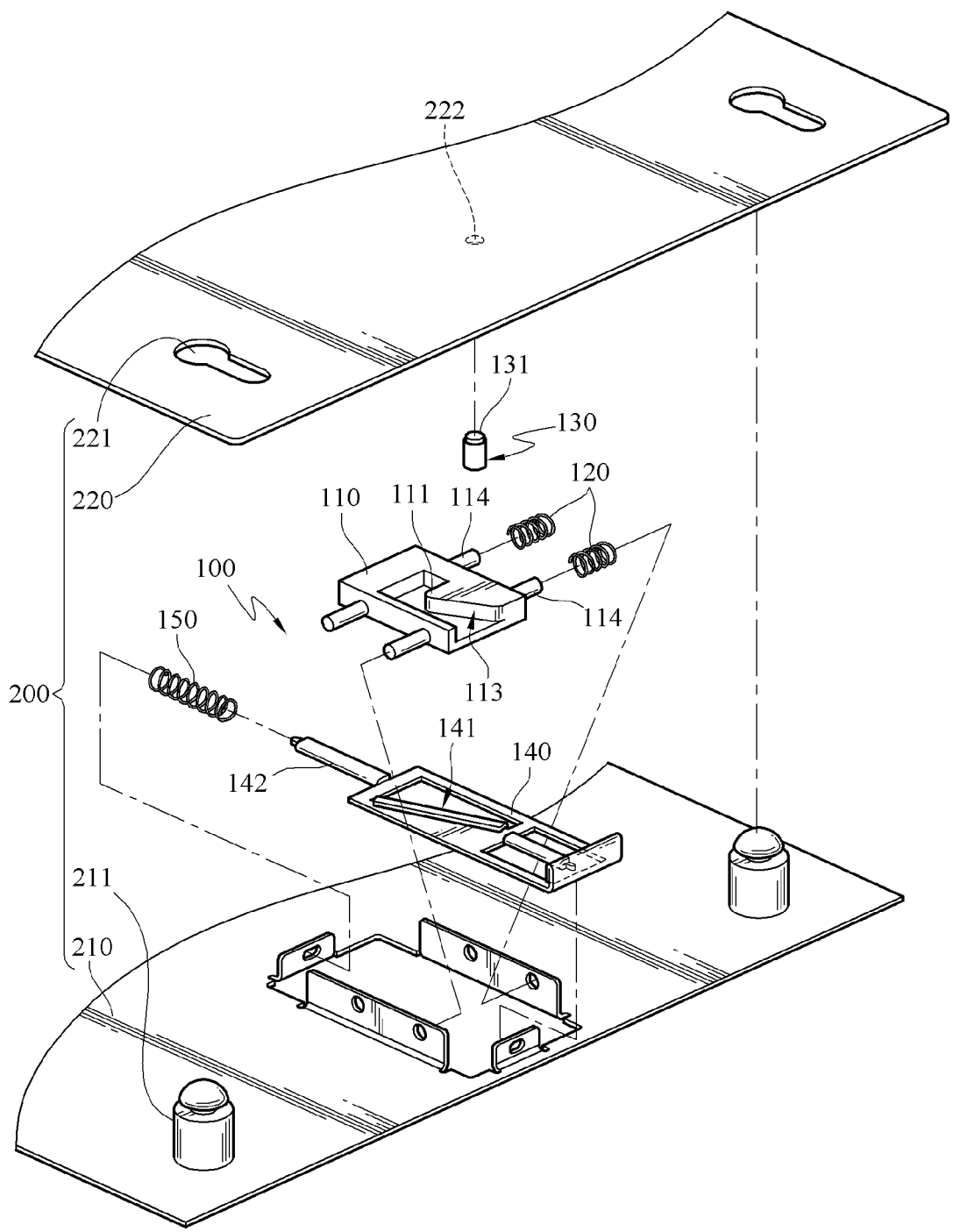
FIG. 2 is an exploded view of a first embodiment of the present invention.

FIG. 2 is an exploded view of the present invention. The retention device 100 disclosed in the present invention is applied in an electronic device 200. The electronic device 200 includes a case 210 and a circuit board 220, the case 210 has at least one combination post 211 thereon, and the circuit board 220 has at least one combination hole 221 formed therein. The combination post 211 is a post with a top size slightly larger than the body size, and the combination hole 221 is a gourd shaped structure formed of a large hole and a small hole extending from the circumference of the large hole, so as to accommodate the top of the combination post 211. The circuit board 220 may shift relative to the case 210 along the integrate direction or the release direction, so that the combination post 211 and the combination hole 221 are engaged with each other, and the circuit board 220 may get caught by the case 210 or detached from the case 210.

Please refer to FIG. 2, the retention device 100 of the present invention includes a fastener 110, two first elastic members 120, a latching member 130, and a releasing member 140. A combination wall standing on the case 210 is formed by sheet metal forming or stamping, and the fastener 110 is movably disposed on the combination wall of the case 210. The moving direction of the fastener 110 is perpendicular to the integrate direction or the release direction, a stopping portion 111 is disposed on an upper surface of the fastener 110, and a pushing portion 112 is protruded on a lower surface of the fastener 110. In addition, two first pins 114 are disposed at one edge of the fastener 110, and a second guide chamfer 113 is disposed on the fastener 110 near the stopping portion 111.

Two first elastic members 120 are respectively sleeved on the first latches 114, with one end leaning against the combination wall of the case 210, and the other end leaning against the fastener 110. The first elastic members 120 are used to normally push the fastener 110, so as to maintain the fastener 110 at a fixing position.

A bump 131 is disposed at one end of the latching member 130, and a combination portion 222 corresponding to the bump 131 is disposed at one side of the circuit board 220 facing to the fastener 110. The bump 131 and the combination portion 222 are engaged with each other, such that the latching member 130 is mounted on a side of the circuit board 220 facing to the fastener 110.

The releasing member 140 is movably disposed on the case 210 and is located on the lower side of the fastener 110 facing to the case 210. The moving direction of the releasing member 140 and the moving direction of the fastener 110 are offset, for example, in this embodiment, the releasing member 140 can shift along the integrate direction or the release direction. The releasing member 140 has a first guide chamfer 141 leaning against the pushing portion 112.

In addition, as shown in FIG. 2, the retention device 100 of the present invention further includes a second elastic member 150. A second pin 142 is disposed at one side of the releasing member 140, and the second elastic member 150 is sleeved on the second latch 142, with one end leaning against a combination wall of the case 210, and the other end leaning against the releasing member 140, such that the second elastic member 150 normally pushes the releasing member 140.

Figure 3A:
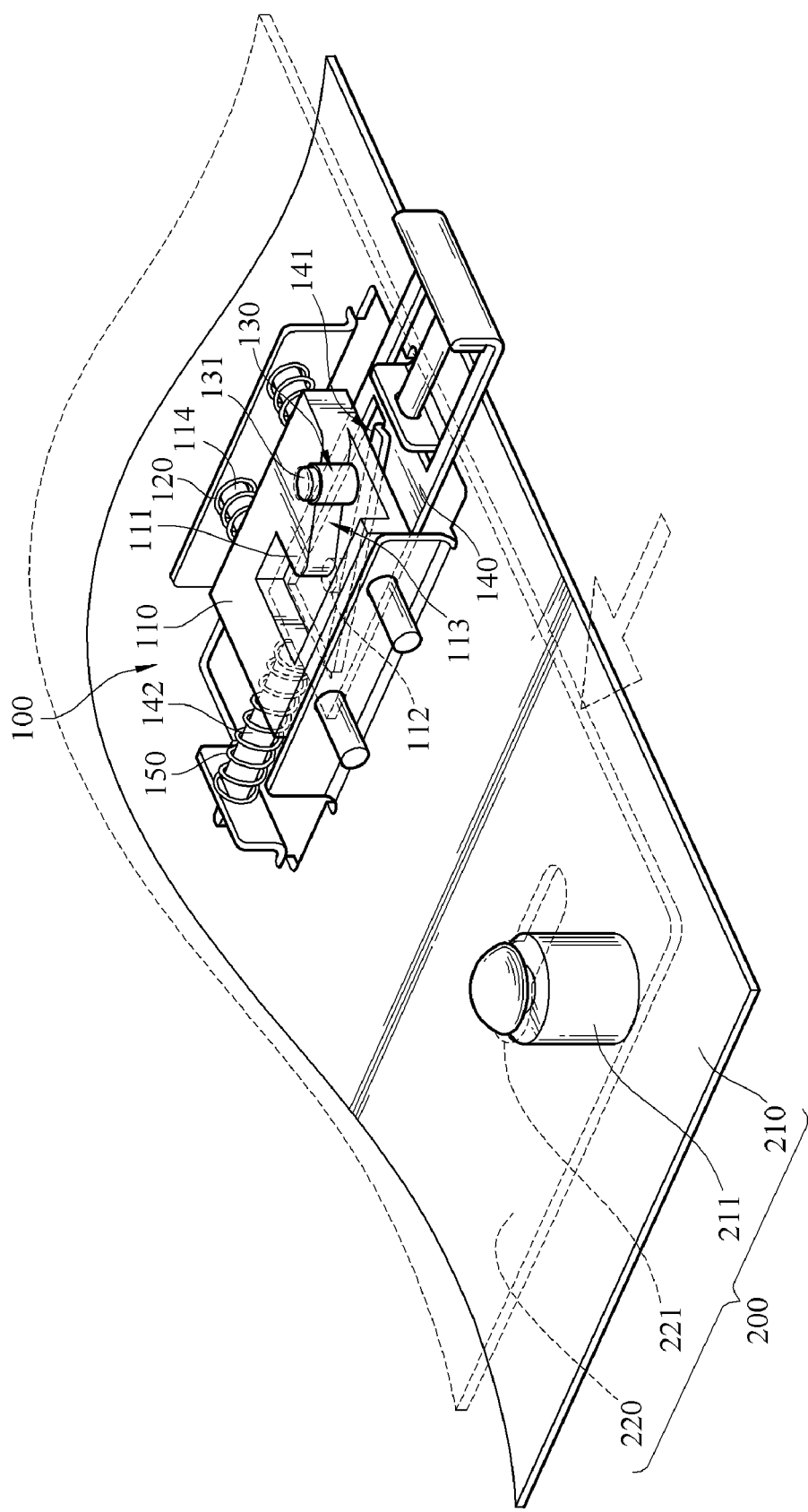
FIG. 3A is a perspective view of the first embodiment of the present invention in a mounting state.
Figure 3B:
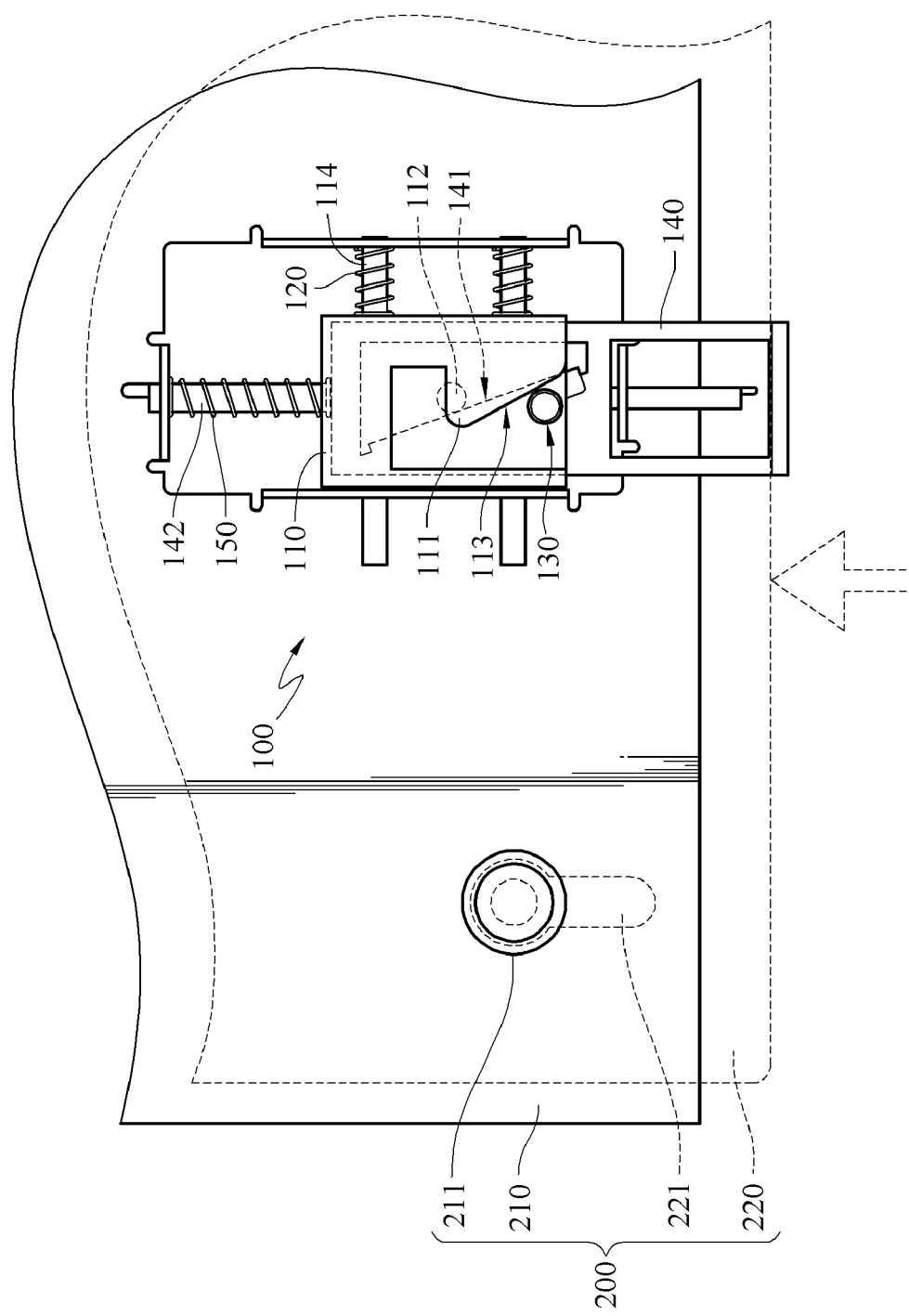
FIG. 3B is a top view of the first embodiment of the present invention in the mounting state.

FIGS. 3A and 3B are a perspective view and a top view of the circuit board in a mounting state. When the latching member 130 shifts with the circuit board 220 along the integrate direction, the latching member 130 pushes the fastener 110 to shift through the guide of the second guide chamfer 113, and the first elastic member 120 is compressed to deform at the same time.

Figure 4A:
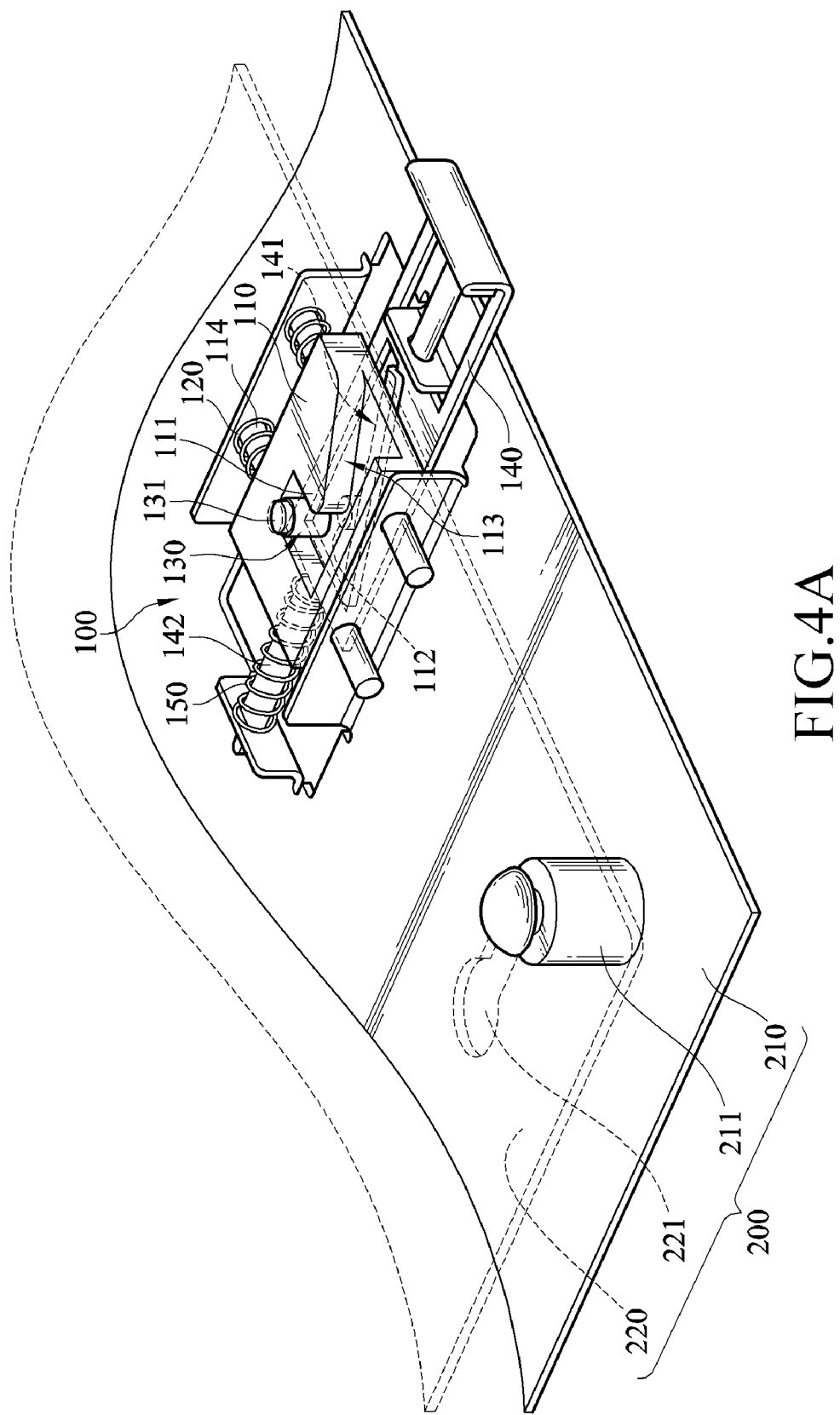
FIG. 4A is a perspective view of the first embodiment of the present invention in a combined state.
Figure 4B:
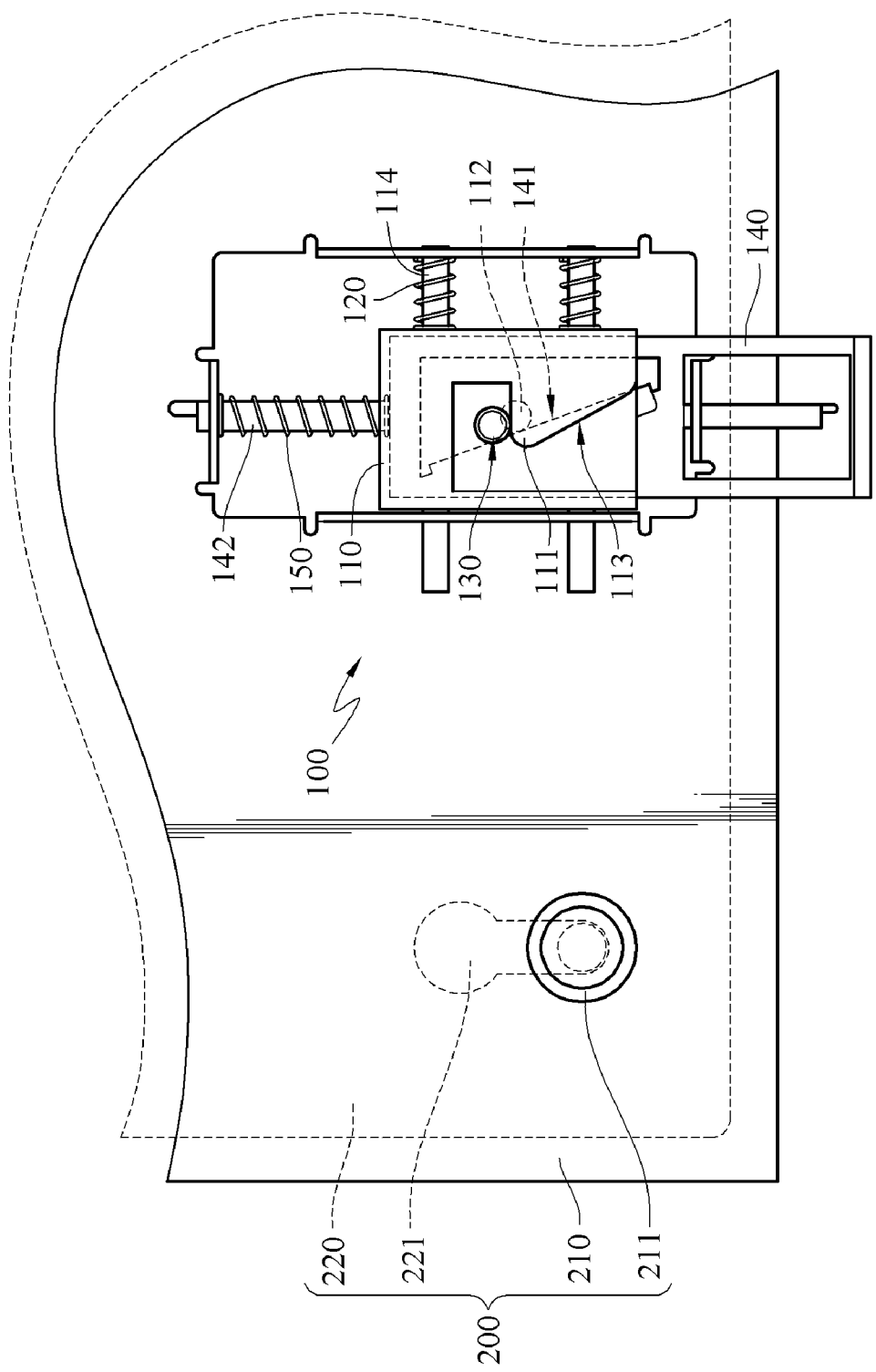
FIG. 4B is a top view of the first embodiment of the present invention in the combined state.

FIGS. 4A and 4B are schematic views of the circuit board in a combined state. The latching member 130 continuously shifts towards the integrate direction, such that the combination hole 221 and the combination post 211 are combined to each other through the guide of the second guide chamfer 113. When the latching member 130 moves into the fastener 110, the formerly compressed first elastic member 120 under a force elastically recovers to the initial state because of the releasing of the force, and pushes the fastener 110 to return to the fixing position. The latching member 130 is limited in the fastener 110 through the blocking of the stopping portion 111 recovering to the initial position, and makes the circuit board 220 be positioned on the case 210.

Figure 5A:
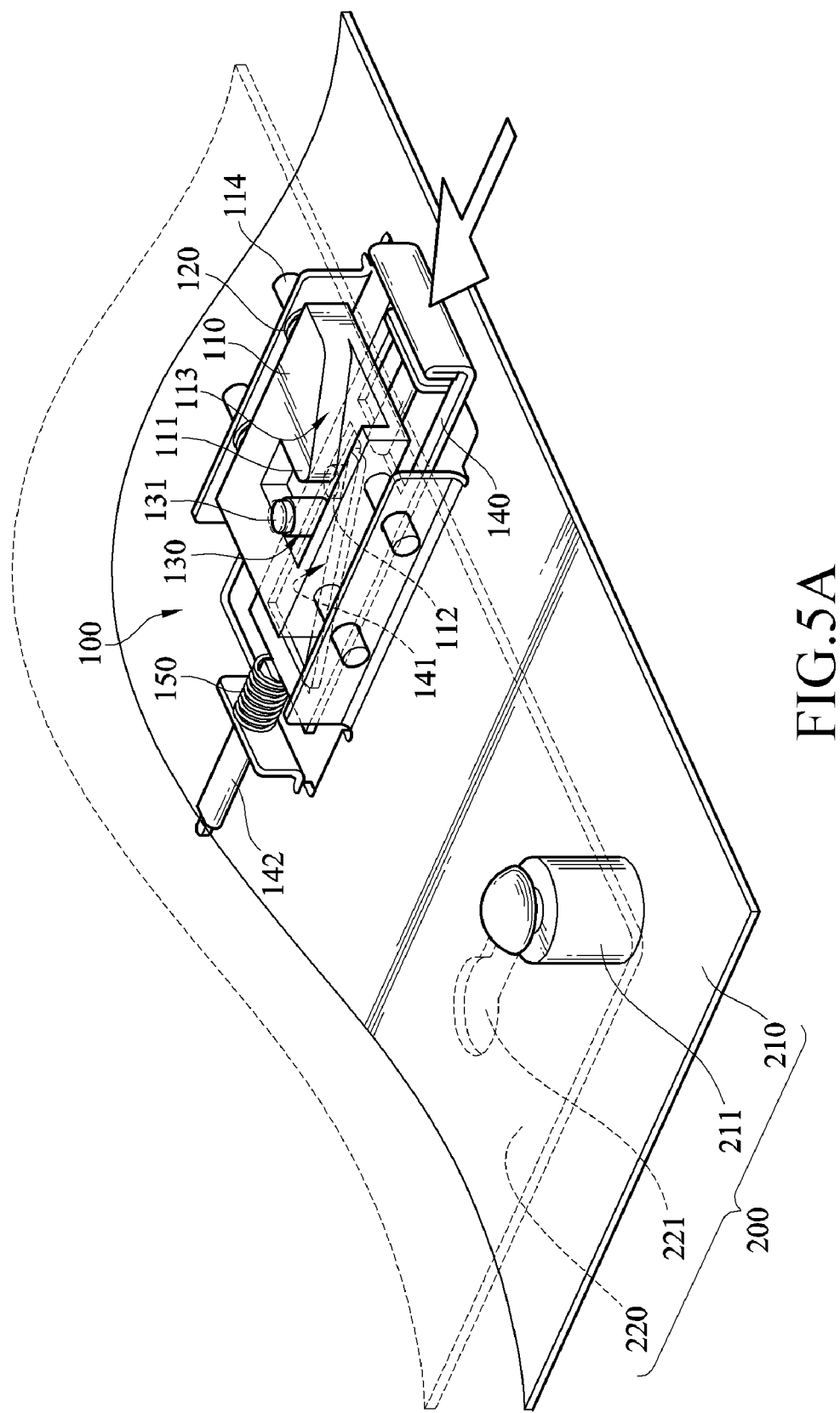
FIG. 5A is a perspective view of the first embodiment of the present invention in a releasing state.
Figure 5B:
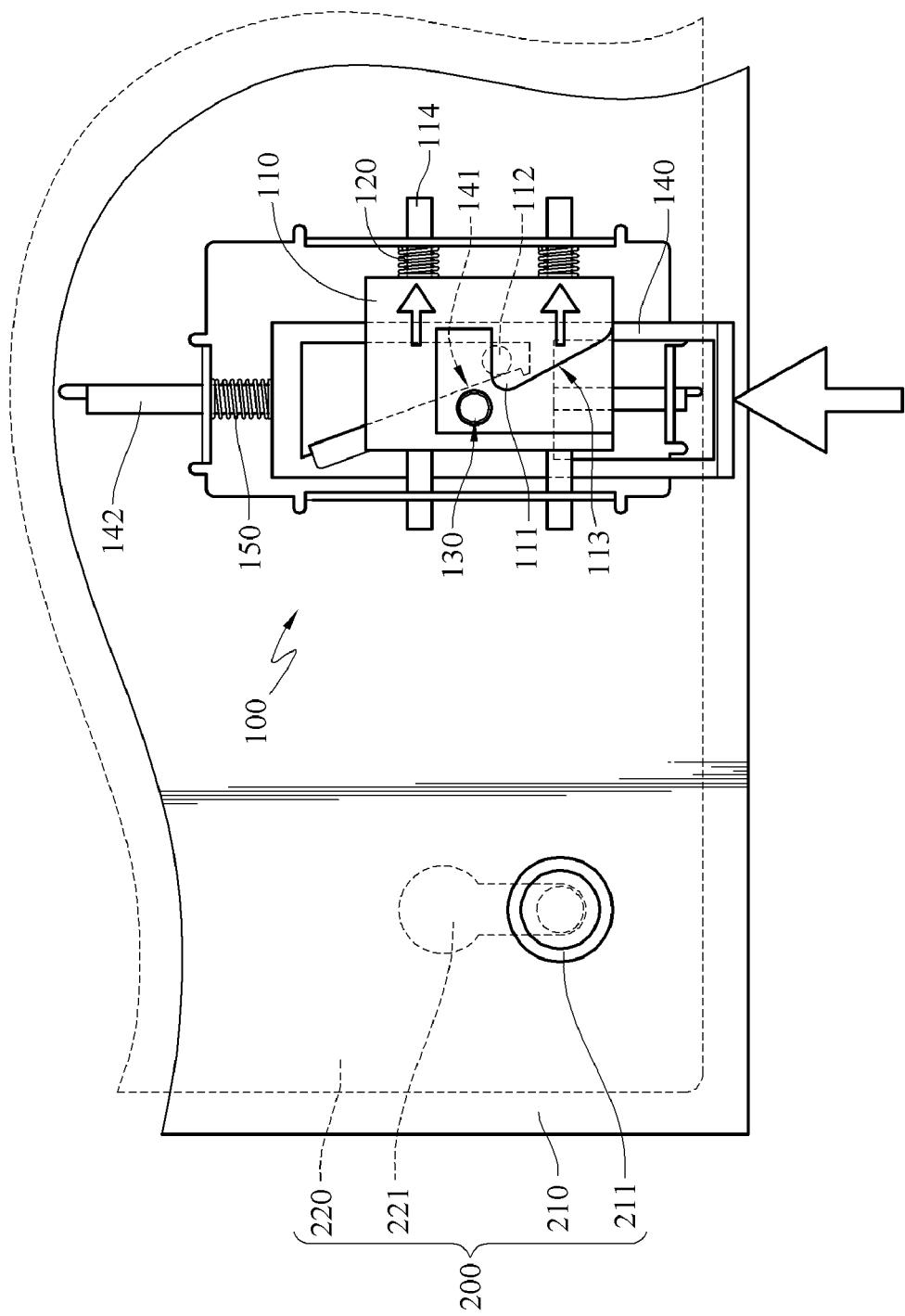
FIG. 5B is a top view of the first embodiment of the present invention in the releasing state.

Referring to FIGS. 5A and 5B, schematic views of the circuit board in a releasing state are shown. When it intends to detach the circuit board 220 from the case 210, the releasing member 140 is pushed to shift relative to the fastener 110 towards the integrate direction, such that the first guide chamfer 141 pushes the pushing portion 112, and makes the fastener 110 shift from the fixing position to the releasing position. The latching member 130 shifts along the release direction to separate from the fastener 110, and the combination post 211 is loosed from the combination hole 221, so as detach the circuit board 220 from the case 210.

Figure 6:
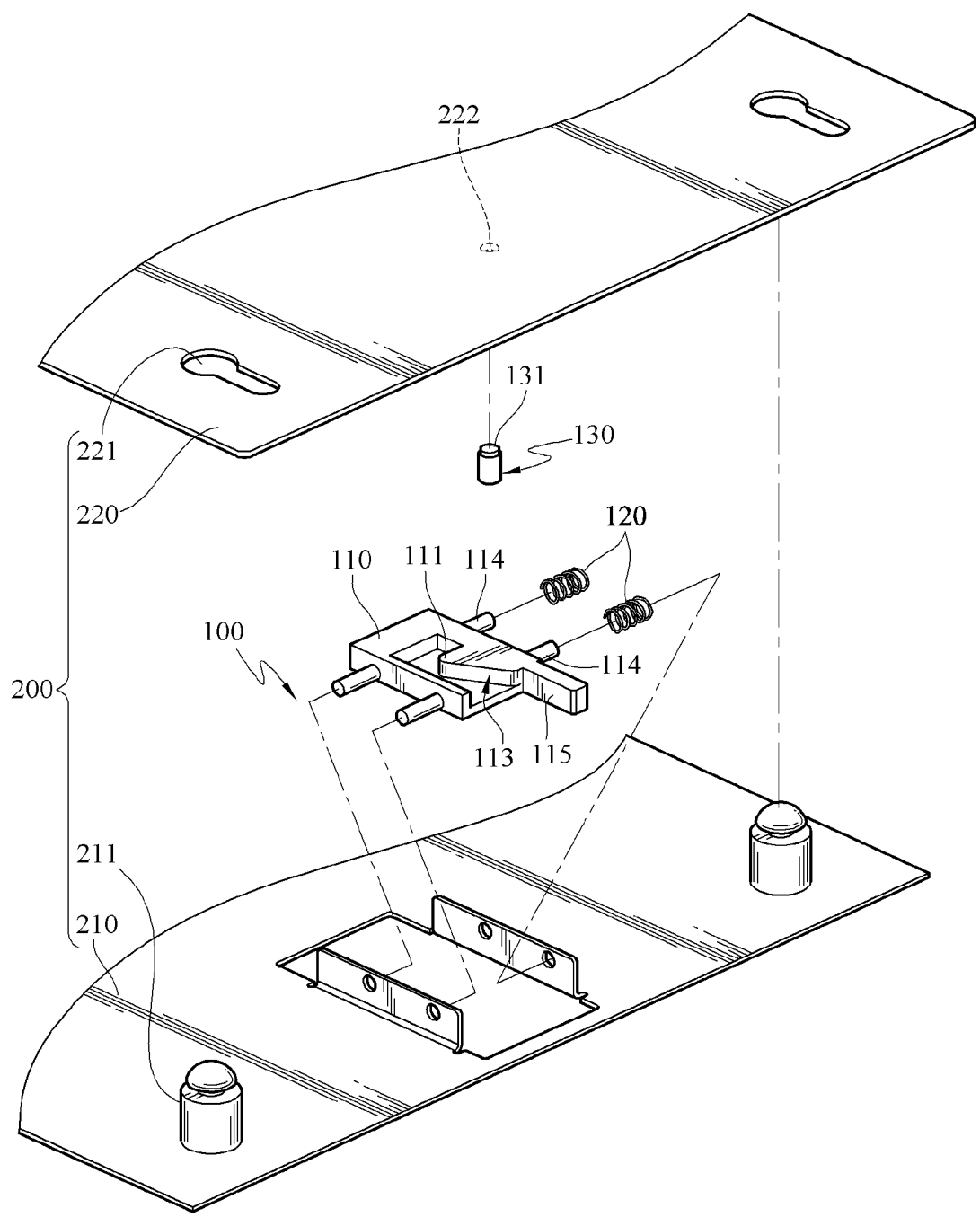
FIG. 6 is an exploded view of a second embodiment of the present invention.

FIG. 6 is an exploded view of a second embodiment of the present invention. The retention device 100 of the second embodiment provided by the present invention includes a fastener 110, two first elastic members 120, and a latching member 130. The operation manner of the second embodiment of the present invention in the combining state is same as that of the first embodiment, but on the operation of releasing the circuit board, it is not necessary to push the fastener 110 to shift through the releasing member (as shown in the first embodiment). Instead, the user can directly pull a handle 115 of the fastener 110, so as to make the fastener 110 separate from the fixing position and shift to the releasing position. The latching member 130 formerly blocked by the stopping portion 110 is released, the latching member 130 may shift along the release direction and separate from the fastener 110, and the combination post 211 looses from the combination hole 221 at the same time, such that the circuit board 220 is detached from the case 210.

The fastener of the present invention is used to block the latching member, such that the circuit board is stably mounted on the case. The releasing member is used to push the fastener, so as to detach the circuit board from the case. It is not necessary for the user to fix the circuit board by using a plurality of groups of bolts, thereby truly achieving the purpose of fixing the circuit board on the case in a screwless manner, enabling users to assemble and disassemble the circuit rapidly and easily, and greatly enhancing the convenience in operation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A retention device, applied on an electronic device having a case and a circuit board, wherein the circuit board shifts relative to the case along a integrate direction or a release direction, such that the circuit board gets caught by the case or be detached from the case, and is fixed on the case through the retention device, comprising:

a fastener, movably disposed on the case and having a stopping portion and a pushing portion, wherein a moving direction of the fastener forms an angle with the integrate direction or the release direction;

at least one first elastic member, having one end disposed on the case and normally pushing the fastener, so as to maintain the fastener at a fixing position; and a latching member, disposed on one side of the circuit board facing to the fastener, the latching member shifting with the circuit board along the integrate direction, and pushing the fastener to remove, so as to be blocked by the stopping portion, or pushing the fastener to separate from the fixing position, such that the latching member is released from the stopping portion.

2. The retention device as claimed in claim 1, comprising a releasing member, movably disposed on the case, and located on one side of the fastener, wherein a moving direction of the releasing member and a moving direction of the fastener are offset, and the releasing member has a first guide chamfer leaning against the pushing portion, for pushing the fastener to separate from the fixing position, such that the latching member is released from the stopping portion.

3. The retention device as claimed in claim 2, comprising a second elastic member disposed on the case, leaning against one end of the releasing member, wherein the second elastic member normally pushes the releasing member, such that the fastener maintains at the fixing position.

4. The retention device as claimed in claim 3, wherein a second pin is further disposed at one end of the releasing member, and the second elastic member is sleeved on the second pin, such that the second elastic member normally pushes the releasing member.

5. The retention device as claimed in claim 1, wherein a second guide chamfer is further disposed at one side of the fastener, so as to guide the latching member to push the fastener to shift.

6. The retention device as claimed in claim 1, wherein at least one first pin is further disposed at one edge of the fastener, the first elastic member is sleeved on the first pin, such that the first elastic member normally pushes the fastener.

7. The retention device as claimed in claim 1, wherein the moving direction of the fastener is perpendicular to the integrate direction or the release direction.

8. The retention device as claimed in claim 1, wherein a bump is further disposed at the latching member, a combination portion corresponding to the bump is disposed at one side of the circuit board, and the bump and the combination portion are engaged to each other, such that the latching member is mounted on the circuit board.

9. The retention device as claimed in claim 1, wherein the circuit board has at least one combination hole, the case has at least one combination post, and the combination hole and the combination post are combined to each other, such that the circuit board gets caught by the case.

* * * * *